(12) United States Patent
Farnworth et al.

(10) Patent No.: US 6,637,638 B1
(45) Date of Patent: Oct. 28, 2003

(54) SYSTEM FOR FABRICATING SOLDER BUMPS ON SEMICONDUCTOR COMPONENTS

(75) Inventors: Warren M. Farnworth, Nampa, ID (US); Ford Grigg, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/023,688

(22) Filed: Dec. 21, 2001

Related U.S. Application Data

(62) Division of application No. 08/905,870, filed on Aug. 4, 1997, now Pat. No. 6,372,624.

(51) Int. Cl.$^7$ ................................................ B23K 1/08
(52) U.S. Cl. ........................................................ 228/36
(58) Field of Search ................................ 438/613, 614, 438/678; 228/36, 40, 43, 260, 203

(56) References Cited

U.S. PATENT DOCUMENTS

| | | |
|---|---|---|
| 3,809,625 A | 5/1974 | Brown et al. |
| 4,661,375 A | 4/1987 | Thomas |
| 4,763,829 A | 8/1988 | Sherry |
| 4,840,820 A | 6/1989 | Schultz et al. |
| 4,927,505 A | 5/1990 | Sharma et al. |
| 4,950,623 A | 8/1990 | Dishon |
| 4,970,571 A | 11/1990 | Yamakawa et al. |
| 4,982,265 A | 1/1991 | Watanabe et al. |
| 5,169,680 A | 12/1992 | Ting et al. |
| 5,308,796 A | 5/1994 | Feldman et al. |
| 5,316,788 A | 5/1994 | Dibble et al. |
| 5,376,584 A | 12/1994 | Agarwala |
| 5,403,671 A | 4/1995 | Holzmann |
| 5,461,261 A | 10/1995 | Nishiguchi |
| 5,491,364 A | 2/1996 | Brandenburg et al. |
| 5,617,990 A | 4/1997 | Thompson, Sr. |
| 5,675,889 A | 10/1997 | Acocella et al. |
| 5,736,456 A | 4/1998 | Akram |
| 5,773,359 A | 6/1998 | Mitchell et al. |
| 5,795,619 A | 8/1998 | Lin et al. |
| 5,851,911 A | 12/1998 | Farnworth |
| 5,903,058 A | 5/1999 | Akram |
| 5,910,354 A | 6/1999 | Meola et al. |
| 6,091,141 A | 7/2000 | Heo |
| 6,372,624 B1 | 4/2002 | Farnworth et al. |

FOREIGN PATENT DOCUMENTS

| | | |
|---|---|---|
| EP | 0 469 848 A2 | 2/1992 |
| JP | 11-040624 | 2/1999 |

OTHER PUBLICATIONS

Aintila et al., "Towards Low Cost High Density Bumping", 1993 Japan International Electronics Manufacturing Technology Symposium, pp. 33–36.*

Tummala, Rao R., *Microelectronics Packaging Handbook*, Van Nostrand Reinhold, pp. 366–381, 1989.

Suss Report, Lorenz H. et al., vol. 10, Third/Fourth Quarter 1996, technical paper.

Seraphim, Donald P., Lasky, Ronald C., Li, Che–Yu, Principles of Electronic Packaging, pp. 600–607, 1989.

Wong, K., Chi, K., Rangappan, A., "Application of Electroless Nickel Plating in the Semiconductor Microcircuit Industry", Plating and Surface Finishing 75(7), pp. 70–76, Jul. 1988.

Yang & Shook, "Bottom–Side Wave Solder Compatibility for 14 & 16 Gull Wing SOIC", 1995, Proceedings of the 45th Electronic Components and Technology Conference, pp. 70–77.

Briggs & Yang, "Experiment Design, Defect Analysis, and Results for the Wave Soldering of Small Outline Integrated Circuits", 1990 Proceedings of the Electronic Manufacturing of Technology Symposium, pp. 361–365.

Ostmann et al., "The pretreatment of Aluminum Bondpads for Electroless Nickel Bumping", 1993 IEEE, pp. 74–78.

Inaba et al., "Solder Bump Formation Using Electroless Plating and Ultrasonic Soldering", IEEE Transactions on Components, Hybrids, and Manufacturing Technology, Vo. 13, No. 1, Mar. 1990.

Aintila et al., "Electroless Ni/Au Bumps for Flipchip–on–Flex and TAB Applications", Proceedings 1994 IEMT Symposium, Sixteenth IEEE/CPMT International, pp. 160–164, vol. 1.

Aschenbrenner et al., "Electroless Nickel/Copper Plating As a New Bump Metallization", Proceedings of the 1994 International Conference on Multichip Modules, 1994, pp. 390–395.

Judd & Brindley, "Soldering in Electronics Assembly", 1992, Butterworth–Heinemann, pp. 143–164.

Wassink, Soldering in Electronics, 2nd Edition, 1989, Electrochemical Publications Limited, pp. 56–57, 78–79, 110, 135–139, 195–196, and 496–497.

* cited by examiner

*Primary Examiner*—Evan Pert
(74) *Attorney, Agent, or Firm*—Stephen A. Gratton

(57) ABSTRACT

A method and system for fabricating solder bumps on semiconductor components are provided. The component can be a wafer, a die, a package, or a BGA substrate. The component is provided with electrodes, such as aluminum bond pads, on which the solder bumps are formed. Initially, the electrodes are cleaned and activated for a subsequent electroless deposition processes. Next, adhesion metal layers are electrolessly deposited on the electrodes to provide adhesion. and a barrier layer on the electrodes. Next, solder wettable layers are electrolessly deposited on the adhesion metal layers, to provide wettable surfaces for depositing the solder bumps. Preferred materials include nickel for the adhesion metal layers, and palladium for the solder wettable layers. A wave soldering process is then used to deposit solder bumps on the solder wettable layers. Selected parameters of the wave soldering process including temperature, solder formulation, conveyor speed, and component orientation can be used to control the size and shape of the deposited solder bumps.

25 Claims, 3 Drawing Sheets

```
┌─────────────────────────────────────────────────────────┐
│ PROVIDING A SEMICONDUCTOR COMPONENT                     │
│ HAVING METAL ELECTRODES, STEP A.                        │
└─────────────────────────────────────────────────────────┘
                            │
┌─────────────────────────────────────────────────────────┐
│ CLEANING AND ACTIVATING THE METAL ELECTRODES FOR        │
│ SUBSEQUENT ELECTROLESS DEPOSITION, STEP B.              │
└─────────────────────────────────────────────────────────┘
                            │
┌─────────────────────────────────────────────────────────┐
│ ELECTROLESSLY DEPOSITING ADHERENCE LAYERS ON            │
│ THE ACTIVATED METAL ELECTRODES, STEP C.                 │
└─────────────────────────────────────────────────────────┘
                            │
┌─────────────────────────────────────────────────────────┐
│ ELECTROLESSLY DEPOSITING SOLDER WETTABLE                │
│ LAYERS ON THE ADHERENCE LAYERS, STEP D.                 │
└─────────────────────────────────────────────────────────┘
                            │
┌─────────────────────────────────────────────────────────┐
│ DEPOSITING SOLDER BUMPS ON THE SOLDER WETTABLE          │
│ LAYERS USING A WAVE SOLDERING PROCESS, STEP E.          │
└─────────────────────────────────────────────────────────┘
```

FIGURE 1

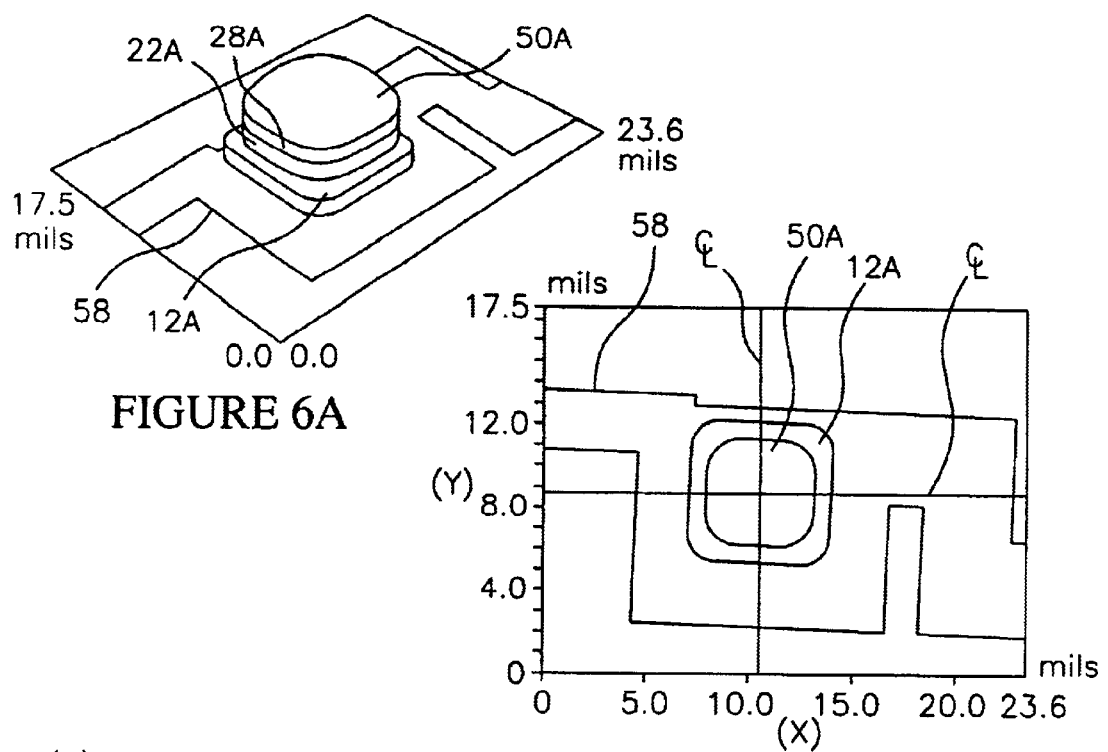
FIGURE 6A
FIGURE 6B
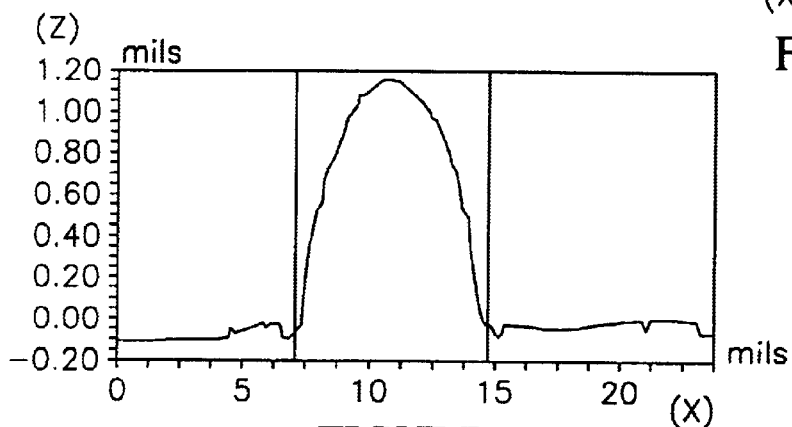
FIGURE 7A  "NOT TO SCALE"
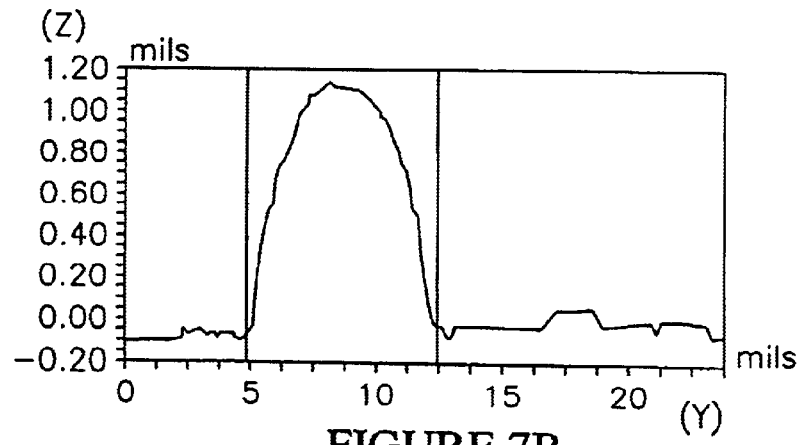
FIGURE 7B  "NOT TO SCALE"

US 6,637,638 B1

SYSTEM FOR FABRICATING SOLDER BUMPS ON SEMICONDUCTOR COMPONENTS

CROSS REFERENCE TO RELATED APPLICATIONS

This application is a division of Ser. No. 08/905,870 filed Aug. 4, 1997, U.S. Pat. No. 6,372,624B1.

FIELD OF THE INVENTION

This invention relates generally to semiconductor manufacture, and more particularly to an improved method and system for fabricating solder bumps on semiconductor components, such as wafers, dice, and chip scale packages.

BACKGROUND OF THE INVENTION

Various semiconductor components include solder bumps, rather than flat bond pads, to provide electrical access to the integrated circuits contained on the component. For example, semiconductor wafers, dice, and chip scale packages, can include solder bumps. The solder bumps allow the dice, or packages, to be flip chip mounted to a printed circuit board, or other supporting substrate.

Different fabrication processes have been developed by semiconductor manufacturers for forming the solder bumps. A typical wafer-level fabrication process utilizes solder wettable pads deposited on aluminum electrodes of the component. The wafer can include a passivation layer, such as BPSG glass, having openings on which the solder wettable pads are formed. Typically, the pads include an adherence layer, such as chromium, which provides adherence to the electrodes and passivation layer. The adherence layer also forms a barrier to prevent the solder bumps from reacting with the underlying electrodes. In addition to the adherence layer, the pads can include a solder wettable layer, such as copper, or other metal having a solderable metallurgy.

Typically, the pads are formed by evaporating, chemical vapor depositing, or electrodepositing the different metal layers through the openings in the passivation layer and onto the electrodes. Following deposition, the solder bumps can be reflowed at about 350° F. to melt and homogenize the bumps. The reflow process also forms the bumps into a hemispherical shape.

Metal masks, or stencils, are typically utilized for depositing the adherence and solder wettable layers onto the electrodes, and for depositing the solder bumps onto the solder wettable pads. Sometimes different masks are employed for each deposition step. For a wafer level bump fabrication process, the masks must be aligned and secured to the wafer each time using tooling fixtures. In general, aligning and securing the masks to the wafers is a time consuming and labor intensive process. It would be advantageous to perform the bump fabrication process without masks.

In addition, the wafer is often subjected to high temperatures during the bump fabrication process and during reflow of the solder bumps. With most semiconductor components it is desirable to maintain a low thermal budget during manufacture, to prevent degradation of semiconductor devices contained on the component. Accordingly, low temperature bump fabrication processes would be advantageous in fabricating bumped semiconductor components.

Still further, vacuum deposition processes, such as evaporation, CVD and electrodeposition, require fabrication equipment used by manufacturers for other semiconductor fabrication processes. However, some metals utilized in fabricating solder bumps, particularly copper, can be contaminants to other fabrication processes. Accordingly, it would be advantageous to perform the bump fabrication process without subjecting other semiconductor fabrication processes to contaminants.

In view of the foregoing, the present invention is directed to an improved method and system for fabricating solder bumps for semiconductor components.

SUMMARY OF THE INVENTION

In accordance with the present invention, an improved method and system for fabricating solder bumps for bumped semiconductor components are provided. The method includes the steps of: cleaning and activating electrodes of a semiconductor component for subsequent electroless deposition; electrolessly depositing adherence layers and solder wettable layers on the cleaned and activated electrodes; and then depositing solder bumps on the electrolessly deposited layers using a wave soldering process.

In an illustrative embodiment, the method is performed on a semiconductor wafer having aluminum electrodes embedded in a glass passivation layer. The method can also be used to fabricate solder bumps on semiconductor dice, chip scale packages, and ball grid array substrates.

During formation of the electrolessly deposited layers, temperatures of less than 100° C. are employed. In addition, each successive layer is formed on an exposed underlying layer, such that masks are not required to locate the underlying layers, or the solder bumps. Preferred materials for the adherence layers include nickel, zinc, chromium, and palladium. Preferred materials for the solder wettable layers include palladium and gold. A size and topography of the solder bumps can be controlled during the wave solder deposition process, such that a solder reflow is not required.

An illustrative system for performing the method comprises: a cleaning and activating bath containing a zincate solution for cleaning and activating the aluminum electrodes on the component; an adherence bath containing a nickel containing solution for electrolessly depositing nickel adherence layers on the aluminum electrodes; a solder wettable bath containing a palladium containing solution for electrolessly depositing palladium solder wettable layers on the adherence layers; and a wave soldering apparatus for depositing solder bumps on the solder wettable layers.

BRIEF DESCRIPTION OF THE DRAWINGS

FIG. 1 is a block diagram illustrating process steps in the method of the invention;

FIG. 6A is an enlarged (10.4x) 3-D plot of a solder bump formed in accordance with the invention;

FIG. 6B is an enlarged (10.4x) 2-D plot of the solder bump shown in FIG. 6A;

FIG. 7A is a graph illustrating an x-profile of the solder bump shown in FIG. 6A; and FIG. 7B is a graph illustrating a y profile of the solder bump shown in. FIGS. 6A.

DETAILED DESCRIPTION OF THE PREFERRED EMBODIMENTS

Referring to FIG. 1, steps in the method of the invention are illustrated. The method, broadly stated, includes the steps of:

Providing a semiconductor component having metal electrodes, step A.

Cleaning and activating the metal electrodes for subsequent electroless deposition, step B.

Electrolessly depositing adherence layers on the activated metal electrodes, step C.

Electrolessly depositing solder wettable layers on the adherence layers, step D.

Depositing solder bumps on the solder wettable layers using a wave soldering process, step E.

Figure 2A:
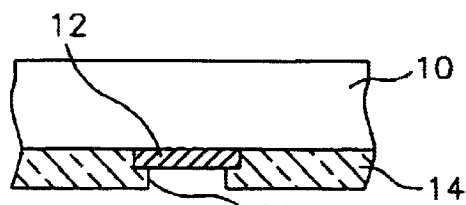
FIG. 2A is a schematic cross sectional view of an aluminum electrode embedded in a passivation layer on a semiconductor component during an activating step.
Figure 2B:
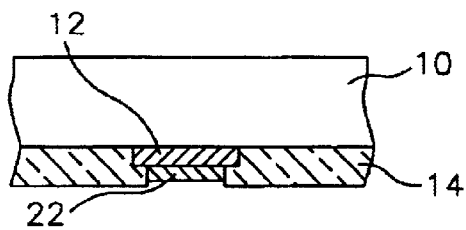
FIG. 2B is a schematic cross sectional view of the electrode illustrating deposition of an adherence layer on the electrode.
Figure 2C:
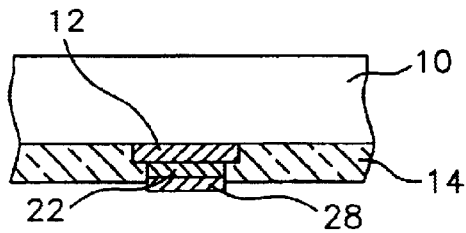
FIG. 2C is a schematic cross sectional view of the electrode illustrating deposition of a solder wettable layer on the adherence layer.
Figure 2D:
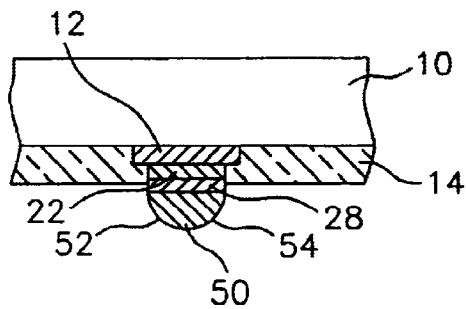
FIG. 2D is a schematic cross sectional view of the electrode illustrating formation of a solder bump on, the solder wettable layer.
Figure 3A:
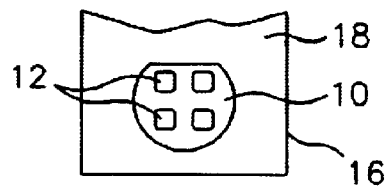
FIG. 3A is a schematic cross sectional view of an electroless plating bath configured to activate the electrodes.

FIGS. 2A–2D and 3A–3D illustrate formation of solder bumps using the above outlined method. As shown in FIGS. 2A and 3A, initially a semiconductor component 10 is provided. By way of example, the component 10 can comprise a semiconductor wafer or portion thereof, a singulated semiconductor die, a semiconductor chip scale package, or a ball grid array (BGA) substrate.

As also shown in FIGS. 2A and 3A, the component 10 includes patterns of electrodes 12 embedded in a passivation layer 14. By way of example, the electrodes 12 can comprise thin film aluminum bond pads in electrical communication with the semiconductor devices and integrated circuits formed on the component 10. Typical aluminum bond pads have a thickness of from 1.0 to 1.5 $\mu$m The passivation layer 14 can comprise a glass such as borophosphosilicate glass (BPSG), or phosphorous silicate glass (PSG). The passivation layer 14 can also comprise an oxide such as $SiO_2$, or a nitride such as $Si_3N_4$. Openings 20 (FIG. 2A) can be provided in the passivation layer 14 to allow access to the electrodes 12.

As shown in FIG. 3A, in order to clean and activate the electrodes 12 for subsequent electroless deposition, the component 10 can be submerged in an activation bath 16. The activation bath contains an activation solution 18 at a temperature of from 20° C. to 40° C. In general, the activation solution functions to strip native oxide layers present on the electrodes 12. One suitable activation solution includes a zincate, such as $ZnO_2$ or $Zn(OH_4)$. Zincate solutions are commercially available from Lea Ronal, as well as other manufacturers.

Figure 3B:
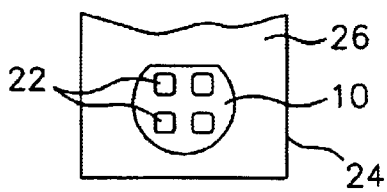
FIG. 3B is a schematic cross sectional view of an electroless plating bath configured to electrolessly deposit adherence layers on the electrodes.

Next, as shown in FIGS. 2B and 3B, adhesion metal layers 22 can be formed on the. electrodes 12. Preferred materials for the adhesion metal layers 22 include nickel, zinc, chromium and palladium. An adhesion bath 24 containing an adhesion metal solution 26 can be used to electrolessly deposit the adhesion metal layers 22, through the openings 20 in the passivation layer 14 onto the electrodes 12. For depositing nickel adhesion metal layers 22, a suitable adhesion metal solution 26 can include nickel chloride, sodium hydroxyacetate, and sodium hypophosphate at a temperature of about 85 to 90° C.

A representative thickness for the adhesion metal layers 22 can be from 500 Å to 10 $\mu$m. This thickness can be achieved by controlling the concentration of the adhesion metal solution 26 and the time period during which the component 10 is submerged. A representative time period for a 6 gm/liter solution containing an adhesion metal compoundcan be from one to five minutes.

Figure 3C:
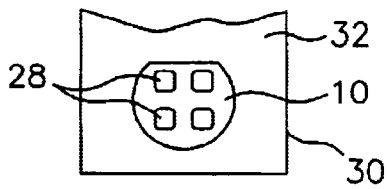
FIG. 3C is a schematic cross sectional view of an electroless plating bath configured to electrolessly deposit solder wettable layers on the adherence layers.

Next, as shown in FIGS. 2C and 3C, solder wettable layers 28 can be formed on the adhesion metal layers 22. Suitable metals for the solder wettable layers 28 include palladium and gold. As shown in FIG. 3C, a solder wettable bath 30 containing a solder wettable solution 32 can be used to electrolessly deposit the solder wettable layers 28 onto the adhesion metal layers 22. For depositing palladium solder wettable layers 28, a suitable solder wettable solution 32 can include palladium chloride and sodium hypophosphate at a temperature of about 50 to 60° C.

A representative thickness for the solder wettable layers 28 can be from 500 Å to 0.1 $\mu$m. This thickness can be achieved by controlling the concentration of the solder wettable solution 32 and the time period for which the component 10 is submerged. A representative time period for a 1 gm/liter solution containing a solder wettable compound can be from one to two minutes.

Figure 3D:
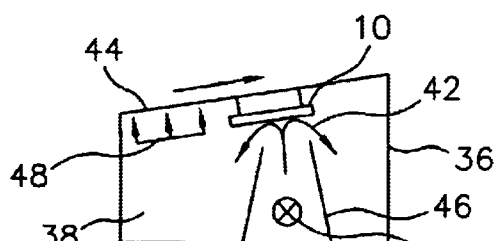
FIG. 3D is a schematic cross sectional view of a wave soldering apparatus configured to deposit solder bumps on the solder wettable layers.

Next, as shown in FIGS. 2D and 3D, solder bumps 50 can be deposited on the solder wettable layers 28 using a wave soldering apparatus 36. The wave soldering apparatus 36 comprises a tank with molten solder 38 formulated as required. Suitable solder formulations include 95%Pb/5%Sn, 60%Pb/40%Sn, 63%In/37%Sn, 100%Sn, and 62%Pb/36%Sn/2%Ag. A representative temperature for the molten solder can be from 180° C. to 260° C.

As shown in FIG. 3D, the wave soldering apparatus 36 includes a pump 40 and baffles 46 configured to produce a turbulent solder wave 42. A conveyor 44 moves the component 10 past the solder wave 42. In addition, a heater element 48 preheats the component 10 prior to exposure to the solder wave 42. One suitable wave soldering apparatus 36 is available from Electrovert of Montreal, Canada and is designated a model no. 605C.

Figure 4:
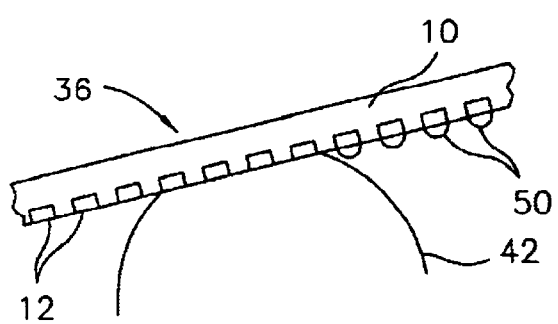
FIG. 4 is an enlarged schematic view of a portion of the wave soldering apparatus illustrating formation of the solder bumps on the component.

As shown in FIG. 4, using the wave soldering apparatus 36, the solder bumps 50 deposit onto the electrodes 12, as the component 10 is moved proximate to the solder wave 42. The solder wettable layers 28 (FIG. 2C) on the electrodes 12 provide surfaces for attracting solder and building the solder bumps 50. In particular with the wettable layers 28 formed of palladium, gold, or other material having an affinity for solder, the solder is attracted to the surfaces of the wettable layers 28. In addition, the process is self aligning in that only the exposed surfaces of the solder wettable layers 28 are plated with solder. With some materials the solder wettable layers 28 will be partially or totally consumed by reaction with the solder. In particular, palladium combines with solder so that the deposited solder bumps 50 can include microscopic spheres of pure palladium embedded in a Pb—Sn matrix.

As shown in FIG. 2D, the solder bumps 50 can be generally hemispherical in shape with a generally rounded tip portion 52 and convex sidewalls 54. A representative height of the solder bumps 50 can be from one mil to five mils. A diameter of the solder bumps 50 is largely determined by the size and geometry of the electrodes 12, with from 2 to 20 mils being representative. The geometry of the solder bumps 50 can also be controlled by the orientation of the component 10 with respect to the solder wave 64 (e.g., above, below, angle etc.), by the temperature of the solder wave 42, and by the speed of the conveyor 44. In general, increased temperatures and higher speeds of the conveyor 44 produce taller solder bumps 50. In addition, orienting the component 10 circuit side down produces taller solder bumps than a circuit side up orientation.

EXAMPLE

Figure 5:
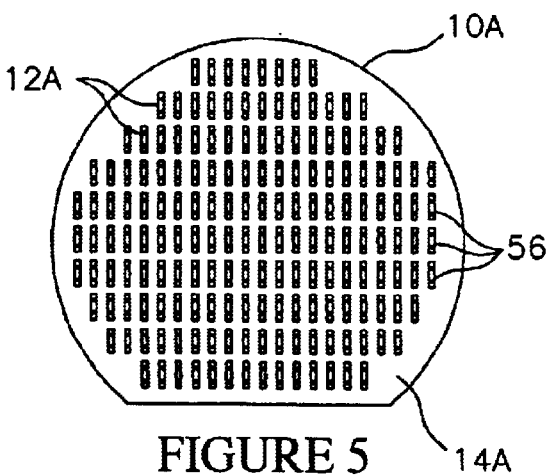
FIG. 5 is a schematic plan view of a semiconductor wafer during processing in accordance with the method of the invention.

The method of the invention was practiced by the inventors in the fabrication of solder bumps on a semiconductor wafer. Referring to FIG. 5, a semiconductor component in the form of a silicon wafer 10A was provided. The silicon wafer 10A included multiple semiconductor dice 56 each having patterns of aluminum electrodes 12A. As shown in FIGS. 6A and 6B, the electrodes 12A were generally square thin film aluminum bond pads with outer dimensions of approximately 8 mils×8 mils. The wafer 10A also included a passivation layer 14A (FIG. 5) formed of BPSG at a thickness of about 1 $\mu$m. In addition, the wafer 10A included underlying metallization layers 58 (FIG. 6A) in electrical communication with the electrodes 12A and integrated circuitry formed on the wafer 10A.

Initially, in order to clean and activate the electrodes 12A, the wafer 10A was submerged in a zincate solution maintained at a temperature of about 25° C. The zincate solution included a zinc compound substantially as previously described.

In order to electrolessly plate nickel adhesion metal layers 22A (FIG. 6A) onto the electrodes 12A, the wafer 10A was submerged in a 6 gm/liter nickel solution comprising nickel chloride, sodium hydroxyacetate, and sodium hypophosphate. The nickel solution was a commercially available formulation supplied by Lea Ronal under the trademark "PALLAMERSE Ni". The nickel solution was maintained at a temperature of about 90° C., and the wafer 10A was submerged in the solution for a time period of about one minute. The resultant nickel adhesion metal layers 22A were electrolessly deposited to a thickness of approximately 2 $\mu$m.

In order to electrolessly plate palladium solder wettable layers 28A (FIG. 6A) on the adhesion metal layers 22A, the wafer 10A was submerged in a 1 gm/liter palladium solution comprising palladium chloride and sodium hypophosphate. The palladium solution was a commercially available formulation supplied by Lea Ronal under the trademark "PALLAMERSE Pd". The palladium solution was maintained at a temperature of about 55° C., and the wafer 10A was submerged in the solution for a time period of about one minute. The resultant palladium solder wettable layers 28A were deposited to a thickness of approximately 800 Å.

In order to deposit solder bumps 50A on the solder wettable layers 28A, the wafer 10A was placed in a wave soldering apparatus manufactured by Electrovert of Montreal, Canada, and designated a model no. 650-C. A molten solder was heated in the wave soldering apparatus to a temperature of about 250° C. The molten solder comprised a 37%Pb/63%Sn solder alloy commercially available under the trademark "ALPHA FLUX 260" from Alpha Metals. The wafer 10A was moved circuitry side down, proximate to the solder wave, at a speed of about 3 feet/minute. In the wave soldering apparatus, the preheat of sections 1 and 2 was off, and the preheat of section 3 was set to 100° C.

A surface height (Rt) of the resultant hemispherical shaped solder bumps 50A was equal to 1.314 mils. In general, the surface height (Rt) of the solder bumps 50A was affected by the size and shape of the electrodes 12A, by the orientation of the wafer 10A with respect to the solder wave, by the temperature of the molten solder, and by the speed of the conveyor. Higher temperatures and faster conveyor speeds produced greater values for (Rt). In addition, moving the wafer through the solder with the circuitry side down (rather than circuitry side up) produced taller solder bumps 50A.

FIG. 7A is an x-profile graph of the solder bumps 50A wherein the height (z axis) of the solder bumps 50A is plotted as a function of the x axis location. FIG. 7B is a y-profile graph of the solder bumps 50A wherein the height (z axis) of the solder bumps 50A is plotted as a function of the y axis location.

Thus the invention provides an improved method and system for fabricating solder bumps for semiconductor components. The method is characterized by low temperatures and simple process steps. In addition, masks and stencils are not required for locating the solder bumps. Still further the size and shape of the solder bumps can be controlled by controlling select process parameters.

While the invention has been described with reference to certain preferred embodiments, as will be apparent to those skilled in the art, certain changes and modifications can be made without departing from the scope of the invention as defined by the following claims.

What is claimed is:

1. A system for fabricating solder bumps on a semiconductor component having a plurality of electrodes comprising:

a layer on the component having a plurality of openings on the electrodes;

a first solution configured to activate the electrodes;

a second solution configured to electrolessly deposit first metal layers on the electrodes;

a third solution configured to electrolessly deposit second metal layers on the first metal layers; and a wave soldering apparatus comprising a tank containing a molten solder, the apparatus configured to generate a molten solder wave, to move the component proximate to the wave, and to deposit molten solder bumps on the second metal layers.

2. The system of claim 1 wherein the first metal layers and the second metal layers comprise a material selected from the group consisting of nickel, zinc, chromium, palladium and gold.

3. The system of claim 1 wherein the molten solder comprises a material selected from the group consisting of 95%Pb/5%Sn, 60%Pb/40%Sn, 63%In/37%Sn, 100%Sn, and 62%Pb/36%Sn/2%Ag.

4. The system of claim 1 wherein the first solution comprises a zincate compound.

5. A system for fabricating solder bumps on a semiconductor component having a plurality of electrodes comprising:

a layer on the component having a plurality of openings on the electrodes;

a first solution configured to activate the electrodes;

a second solution configured to electrolessly deposit first metal layers on the electrodes, the second solution comprising nickel chloride, sodium hydroxyacetate, and sodium hypophosphate;

a third solution configured to electrolessly deposit second metal layers on the first metal layers; and a wave soldering apparatus comprising a tank containing a molten solder, the apparatus configured to generate a molten solder wave, to move the component proximate to the wave, and to deposit the molten solder on the second metal layers.

6. A system for fabricating solder bumps on a semiconductor component having a plurality of electrodes comprising:

a layer on the component having a plurality of openings on the electrodes;

a first solution configured to activate the electrodes;

a second solution configured to electrolessly deposit first metal layers on the electrodes;

a third solution configured to electrolessly deposit second metal layers on the first metal layers, the third solution comprising palladium chloride and sodium hypophosphate; and a wave soldering apparatus comprising a tank containing a molten solder, the apparatus configured to generate a molten solder wave, to move the component proximate to the wave, and to deposit the molten solder on the second metal layers.

7. The system of claim 6 wherein the second metal layers comprise a material selected from the group consisting of nickel, zinc, chromium, palladium and gold.

8. The system of claim 6 wherein the component comprises a semiconductor wafer.

9. The system of claim 6 wherein the component comprises a semiconductor die.

10. The system of claim 6 wherein the component comprises a semiconductor package.

11. A system for fabricating solder bumps on a semiconductor component having a plurality of electrodes comprising:

a wafer containing the component comprising a layer having a plurality of openings on the electrodes;

a first solution configured to activate the electrodes;

a second solution configured to electrolessly deposit first metal layers on the electrodes;

a third solution configured to electrolessly deposit second metal layers on the first metal layers; and a wave soldering apparatus comprising a tank containing a molten solder, the apparatus configured to generate a molten solder wave, to move the component proximate to the wave, and to deposit molten solder bumps on the second metal layers.

12. The system of claim 11 wherein the molten solder comprises a solder selected from the group consisting of 95%Pb/5%Sn, 60%Pb/40%Sn, 63%In/37%Sn, 100%Sn, and 62%Pb/36%Sn/2%Ag.

13. The system of claim 11 wherein the first solution comprises a zincate solution.

14. A system for fabricating solder bumps on a semiconductor component having a plurality of electrodes comprising:

a wafer containing the component comprising a layer having a plurality of openings on the electrodes;

a first solution configured to activate the electrodes;

a second solution configured to electrolessly deposit first metal layers on the electrodes, the second solution comprising nickel chloride, sodium hydroxyacetate, and sodium hypophosphate;

a third solution configured to electrolessly deposit second metal layers on the first metal layers; and a wave soldering apparatus comprising a tank containing a molten solder, the apparatus configured to generate a molten solder wave, to move the component proximate to the wave, and to deposit molten solder bumps on the second metal layers.

15. A system for fabricating solder bumps on a semiconductor component having a plurality of electrodes comprising:

a wafer containing the component comprising a layer having a plurality of openings on the electrodes;

a first solution configured to activate the electrodes;

a second solution configured to electrolessly deposit first metal layers on the electrodes;

a third solution configured to electrolessly deposit second metal layers on the first metal layers, the third solution comprising palladium chloride and sodium hypophosphate; and a wave soldering apparatus comprising a tank containing a molten solder, the apparatus configured to generate a molten solder wave, to move the component proximate to the wave, and to deposit molten solder bumps on the second metal layers.

16. The system of claim 15 wherein the first metal layers comprise a material selected from the group consisting of nickel, zinc, chromium, palladium and gold.

17. The system of claim 15 wherein the second metal layers comprise a material selected from the group consisting of nickel, zinc, chromium, palladium and gold.

18. The system of claim 15 wherein the layer comprises a passivation layer.

19. The system of claim 15 wherein the layer comprises a material selected from the group consisting of borophosphosilicate glass (BPSG) and phosphorus silicate glass (PSG).

20. A system for fabricating solder bumps on a semiconductor component having a plurality of electrodes comprising:

a layer on the component having a plurality of openings on the electrodes;

a zincate solution configured to activate the metal electrodes;

a nickel chloride solution comprising sodium hypophosphate, configured to electrolessly deposit nickel layers on the electrodes;

a palladium chloride solution comprising sodium hypophosphate, configured to electrolessly deposit palladium layers on the nickel layers; and a wave soldering apparatus comprising a tank containing molten solder, the apparatus configured to generate a molten solder wave, to move the component proximate to the wave, and to deposit molten solder bumps on the nickel layers.

21. The system of claim 20 wherein the molten solder comprises a solder selected from the group consisting of 95%Pb/5%Sn, 60%Pb/40%Sn, 63%In/37%Sn, 100%Sn, and 62%Pb/36%Sn/2%Ag.

22. The system of claim 20 wherein the layer comprises a material selected from the group consisting of borophosphosilicate glass (BPSG) and phosphorus silicate glass (PSG).

23. The system of claim 20 wherein the component is contained on a semiconductor wafer comprising a plurality of components.

24. The system of claim 20 wherein the component comprises a semiconductor die.

25. The system of claim 20 wherein the component comprises a semiconductor package.

* * * * *